United States Patent
Marsh

(10) Patent No.: US 6,187,392 B1
(45) Date of Patent: *Feb. 13, 2001

(54) LASER DESORPTION OF CVD PRECURSOR SPECIES

(75) Inventor: Eugene P. Marsh, Boise, ID (US)

(73) Assignee: Micron Technology, Inc., Boise, ID (US)

(*) Notice: Under 35 U.S.C. 154(b), the term of this patent shall be extended for 0 days.

This patent is subject to a terminal disclaimer.

(21) Appl. No.: 09/491,967

(22) Filed: Jan. 27, 2000

Related U.S. Application Data

(63) Continuation of application No. 08/879,747, filed on Jun. 20, 1997, now Pat. No. 6,051,287.

(51) Int. Cl.$^7$ ................................................ C23C 16/48
(52) U.S. Cl. .................. 427/582; 427/586; 427/596; 427/248.1; 427/226
(58) Field of Search .................. 427/582, 586, 427/596, 248.1, 226

(56) References Cited

U.S. PATENT DOCUMENTS

| | | |
|---|---|---|
| 4,880,670 | 11/1989 | Erbil . |
| 4,915,988 | 4/1990 | Erbil . |
| 4,970,196 | * 11/1990 | Kim et al. . |
| 5,072,120 | 12/1991 | Siewick . |
| 5,118,937 | 6/1992 | Hillenkamp et al. . |
| 5,173,441 | 12/1992 | Yu et al. . |
| 5,183,510 | 2/1993 | Kimura . |
| 5,338,580 | 8/1994 | Katagiri et al. . |
| 5,382,793 | 1/1995 | Weinberger et al. . |
| 5,384,289 | 1/1995 | Westmoreland . |
| 5,571,572 | 11/1996 | Sandhu . |
| 5,572,052 | 11/1996 | Kashihara et al. . |
| 5,600,533 | 2/1997 | Sano et al. . |
| 5,607,601 | 3/1997 | Loper et al. . |
| 6,051,287 | * 4/2000 | Marsh . |

OTHER PUBLICATIONS

Ban et al., Journal of Materials Science, vol. 5, No. 11, pp 978–982, 1970 (no month).

Zare, Richard N. et al., "Mass Spectrometry of Molecular Adsorbates Using Laser Desorption/Laser Multiphoton Ionization" Chemical Society of Japan, Jan. 1988, pp 87–92.

Hillenkamp, Franz et al., "Matrix–Assisted Laser Desorption/Ionization Mass Spectrometry of Biopolymers" Analytical Chemistry, vol. 63, No. 24, Dec. 15, 1991, pp 1193–1203.

Deckert A.A. and George S.M., "Heating Rates Required for Laser Induced Thermal Description Studies of Surface Reaction Kinetics" Elsevier Science Publishers B.V., Dec. 2, 1986, pp L215–L221.

Zare R.N and Levine R.D., "Mechanism for Bond–Selective Processes in Laser Desorption" Elsevier Science Publishers B.V., May 22, 1987, pp 593–599.

* cited by examiner

*Primary Examiner*—Timothy Meeks
(74) *Attorney, Agent, or Firm*—Killworth, Gothman, Hagan & Schaeff, LLP

(57) ABSTRACT

Relatively cool chemical vapor deposition precursor particles are desorbed from a target by increasing the temperature of a selected target area at a heating rate of at least about $10^6$ K/sec such that heat energy causes the desorption of at least one CVD precursor particle intact from the target, such that intermediate bonds between the precursor particles and adjacent particles are heated at a higher rate than the precursor's internal bonds, or such that a substantial portion of heat energy is not transferred to the internal modes of the CVD precursor particle.

4 Claims, 3 Drawing Sheets

LASER DESORPTION OF CVD PRECURSOR SPECIES

This application is a continuation of U.S. patent application Ser. No. 08/879,747, filed Jun. 20, 1997, now U.S. Pat. No. 6,051,287 and is also related to U.S. patent application Ser. No. 09/489,783 filed Jan. 24, 2000 now U.S. Pat. No. 6,143,085.

BACKGROUND OF THE INVENTION

The present invention relates to the laser desorption of CVD precursor species and, more particularly, to the desorption of CVD precursor species by heating a target at a rate designed to selectively desorb relatively cool molecules therefrom. Further, the present invention relates to chemical vapor deposition incorporating the laser desorption technique of the present invention.

Stated broadly, chemical vapor deposition (CVD) includes any process in which a material is deposited on a substrate by decomposition of one or more precursor materials within a process chamber. In conventional CVD, the precursor is carried into the process chamber by a carrier gas flow by gradually heating the precursor to a temperature above its vaporization temperature such that the vaporized precursor is entrained in the carrier gas flow. Unfortunately, some CVD precursor materials are difficult to vaporize quickly and uniformly. Other CVD precursors are thermally unstable (i.e., the precursor decomposes) at temperatures required for sublimation. Additionally, the present inventor has identified specific CVD precursor materials characterized by respective decomposition and vaporization temperatures which are very nearly the same. Accordingly, it would not be practical to utilize conventional precursor heating schemes to introduce these precursors into a CVD carrier gas stream because significant decomposition of the precursor would occur upon heating.

Accordingly, there is a need for a system wherein CVD precursor species may be entrained in a carrier gas or otherwise transported to a CVD process without raising the temperature of the CVD precursor to its characteristic vaporization temperature.

BRIEF SUMMARY OF THE INVENTION

This need is met by the present invention wherein CVD precursor particles are desorbed from a target by increasing the temperature of a selected target area at a predetermined heating rate such that heat energy causes the desorption of at least one CVD precursor particle intact from the target, such that intermediate bonds between the precursor particles and adjacent particles are heated at a higher rate than the precursor's internal bonds, or such that a substantial portion of heat energy is not transferred to the internal modes of the CVD precursor particle.

In accordance with one embodiment of the present invention, a chemical vapor deposition process is provided comprising the steps of: positioning a target within a chamber, the target comprising CVD precursor particles; transferring heat energy to a selected target area to induce a predetermined temperature increase in the selected target area, wherein the predetermined temperature increase is characterized by a predetermined heating rate, and wherein the predetermined heating rate is selected such that the heat energy causes the desorption of at least one CVD precursor particle to define a precursor desorption region and such that a substantial portion of the heat energy is not transferred to the internal modes of the CVD precursor particle; and positioning a deposition substrate in particulate communication with the precursor desorption region.

The process may further comprise the steps of: directing the desorbed precursor particle towards a surface of the deposition substrate; and causing the desorbed precursor particle to decompose on the deposition substrate surface. The desorbed precursor particle may be caused to migrate on the deposition substrate surface prior to the decomposition. The desorbed precursor particle may comprise a molecule selected so as to migrate and decompose on the deposition substrate surface upon contact with the deposition substrate surface.

The precursor particles may comprise molecules of a first chemical composition, adjacent particles may comprise molecules of a second chemical composition, and the first chemical composition may be different than the second chemical composition. The precursor particles may comprise precursor molecules and adjacent particles may comprise adjacent molecules bonded to the precursor molecules via van der Waals forces. The precursor particles may comprise precursor atoms and adjacent particles may comprise adjacent atoms bonded to the precursor atoms. Adjacent particles may form a target substrate and precursor particles may be supported by the target substrate. As a final example, adjacent particles and the precursor particles may form a solution.

In accordance with another embodiment of the present invention a chemical vapor deposition apparatus is provided comprising a chamber, a target, a desorption heat source, and a deposition substrate. The chamber defines a precursor desorption region. The target is positioned within the precursor desorption region and comprises CVD precursor particles. The desorption heat source is arranged to induce a predetermined temperature increase in a selected target area by transferring heat energy to the selected target area. The predetermined temperature increase is characterized by a predetermined heating rate and the predetermined heating rate is selected such that the heat energy causes the desorption of at least one CVD precursor particle to define a precursor desorption region and such that a substantial portion of the heat energy is not transferred to the internal modes of the CVD precursor particle. The deposition substrate is positioned in particulate communication with the precursor desorption region. The precursor desorption region and the deposition substrate may be spaced apart along a precursor flow path or may be defined in a common area.

In accordance with yet another embodiment of the present invention a chemical vapor deposition process is provided comprising the steps of: positioning a target within a chamber, the target comprising CVD precursor particles bound to adjacent particles via intermediate bonds; transferring heat energy to a selected target area to induce a predetermined temperature increase in the selected target area, wherein the predetermined temperature increase is characterized by a predetermined heating rate, and wherein the predetermined heating rate is selected such that the intermediate bonds are heated at a higher rate than internal bonds of the precursor particles; and positioning a deposition substrate in particulate communication with the precursor desorption region.

In accordance with yet another embodiment of the present invention, a chemical vapor deposition apparatus is provided comprising a chamber, a target, a desorption heat source, and a deposition substrate. The chamber defines a precursor desorption region. The target is positioned within the precursor desorption region and comprises CVD precursor particles bound to adjacent particles via intermediate bonds. The desorption heat source is arranged to induce a predetermined temperature increase in a selected target area. The predetermined temperature increase is characterized by a predetermined heating rate and the predetermined heating rate is selected such that the intermediate bonds are heated at a higher rate than internal bonds of the precursor particles. The deposition substrate positioned in particulate communication with the precursor desorption region.

In accordance with yet another embodiment of the present invention a chemical vapor deposition process is provided comprising the steps of: positioning a target within a chamber, the target comprising CVD precursor particles; transferring heat energy to a selected target area to induce a predetermined temperature increase in the selected target area, wherein the predetermined temperature increase is characterized by a predetermined heating rate, wherein the predetermined heating rate is selected such that the heat energy causes the desorption of at least one CVD precursor particle intact from the target; and heating a deposition substrate positioned in particulate communication with the precursor desorption region such that the desorbed precursor particle, upon contact with the deposition substrate, migrates and decomposes on the deposition substrate.

In accordance with yet another embodiment of the present invention a chemical vapor deposition apparatus is provided comprising a chamber, a target, a desorption heat source, a deposition substrate, and a deposition region heat source. The chamber defines a precursor desorption region. The target is positioned within the precursor desorption region and comprises CVD precursor particles. The desorption heat source is arranged to induce a predetermined temperature increase in a selected target area by transferring heat energy to the selected target area. The predetermined temperature increase is characterized by a predetermined heating rate and the predetermined heating rate is selected such that the heat energy causes the desorption of at least one CVD precursor particle intact from the target. The deposition substrate is positioned in particulate communication with the precursor desorption region and the deposition region heat source is arranged to heat the deposition substrate such that desorbed precursor particles, upon contact with the deposition substrate, migrate and decompose on the deposition substrate. The CVD particle may comprise a molecule selected from the group consisting of $Ba(Thd)_2$, $Sr(Thd)_2$, and $TiO(DPM)_2$.

In accordance with yet another embodiment of the present invention a chemical vapor deposition process is provided comprising the steps of: positioning a target within a chamber, the target comprising CVD precursor particles and adjacent particles; desorbing the precursor particles from the target to define a precursor desorption region adjacent the target by increasing the temperature of a selected target area at a heating rate of at least about $10^6$ K/sec; and positioning a deposition substrate in particulate communication with the precursor desorption region. The temperature of the selected target area may be increased by focusing a pulsed laser beam on the selected target area, wherein the pulsed laser beam is characterized by a pulse width of about 10 ns or less.

In accordance with yet another embodiment of the present invention a chemical vapor deposition apparatus is provided comprising a chamber, a target, a desorption heat source, and a deposition substrate. The chamber defines a precursor desorption region. The target is positioned within the precursor desorption region and comprises CVD precursor particles and adjacent particles. The desorption heat source is arranged to induce a predetermined temperature increase in a selected target area. The predetermined temperature increase is characterized by a heating rate of at least about $10^6$ K/sec. The deposition substrate is positioned in particulate communication with the precursor desorption region.

In accordance with yet another embodiment of the present invention a chemical vapor deposition process is provided comprising the steps of: positioning a target within a chamber, the target comprising CVD precursor particles bonded to adjacent particles via an intermediate bond, wherein the intermediate bond is characterized by a photo-absorption band; desorbing at least one precursor particles from the target by focusing a pulsed laser beam of a predetermined wavelength on a selected target area, wherein the pulsed laser beam is tuned so as to increase the temperature of the selected target area at a heating rate of at least about $10^6$ K/sec, and wherein the predetermined wavelength matches to the photo-absorption band; and positioning a deposition substrate in particulate communication with the precursor desorption region.

In accordance with yet another embodiment of the present invention a chemical vapor deposition process is provided comprising the steps of: positioning a target within a chamber, the target comprising CVD precursor particles bound to adjacent particles via intermediate bonds; transferring heat energy to a selected target area to induce a predetermined temperature increase in the selected target area, wherein the predetermined temperature increase is characterized by a predetermined heating rate, and wherein the predetermined heating rate is selected such that the heat energy causes the desorption of at least one CVD precursor particle intact from the target to define a precursor desorption region and such that the intermediate bonds are heated at a higher rate than internal bonds of the precursor particles and a substantial portion of the heat energy is not transferred to the internal modes of the CVD precursor particle; positioning a deposition substrate in particulate communication with the precursor desorption region; directing the desorbed precursor particle towards a surface of the deposition substrate; and heating a deposition substrate positioned in particulate communication with the precursor desorption region such that the desorbed precursor particle, upon contact with the deposition substrate, migrates and decomposes on the deposition substrate.

Accordingly, it is an object of the present invention to enable the desorption of relatively cool intact CVD precursor species from a target by heating the target at a sufficiently high rate. Further, it is an object of the present invention to cause the intact desorbed precursor to migrate about the surface of a deposition substrate and decompose to form a deposition layer on the deposition substrate.

DETAILED DESCRIPTION OF THE INVENTION

Figure 1:
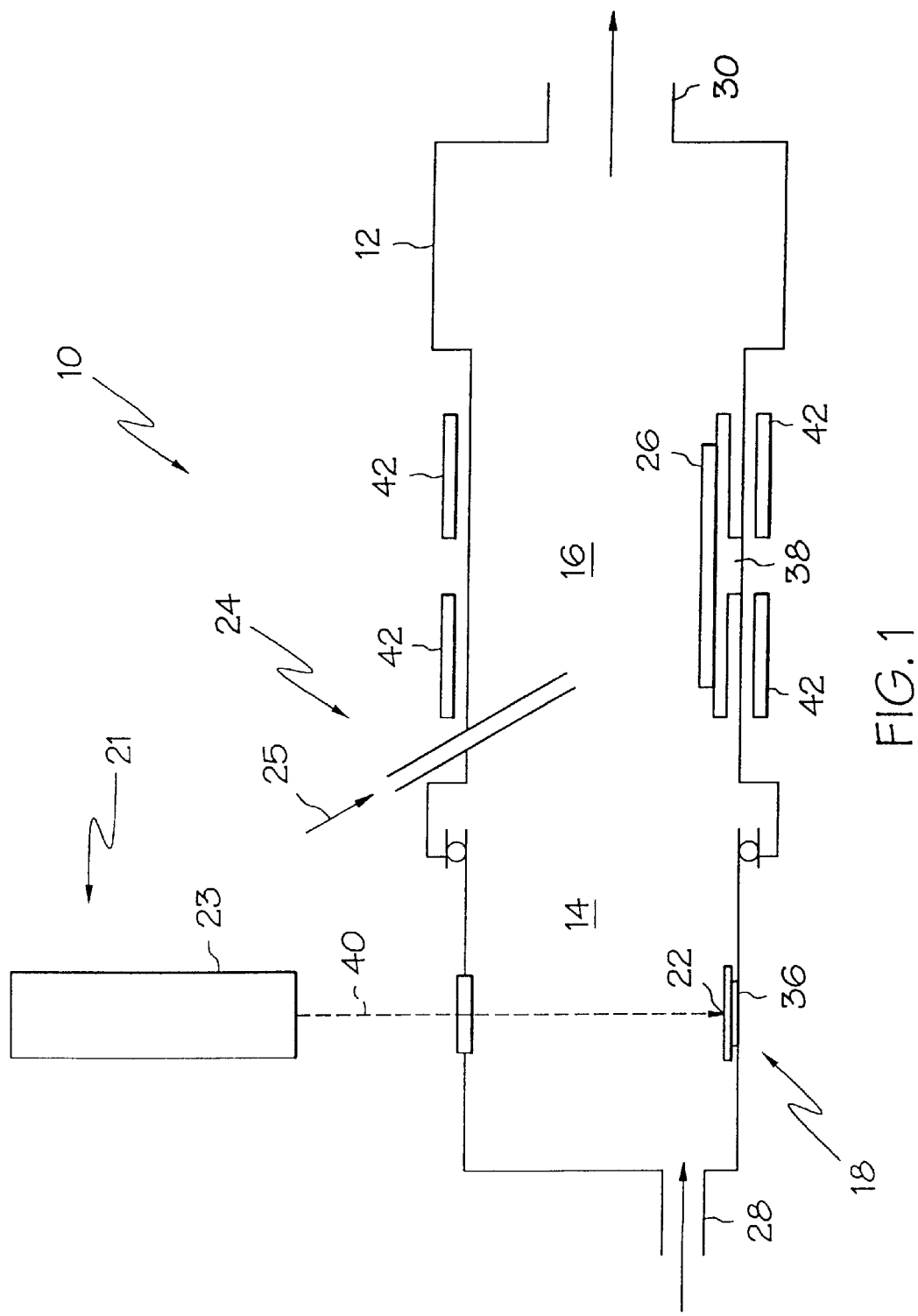
FIG. 1 is a schematic illustration of a chemical vapor deposition apparatus according to the present invention.

A chemical vapor deposition (CVD) apparatus 10 according to the present invention, and the CVD process corresponding thereto, are described in detail herein with reference to FIGS. 1–5, where like structure is indicated with like reference numerals.

Figure 2:
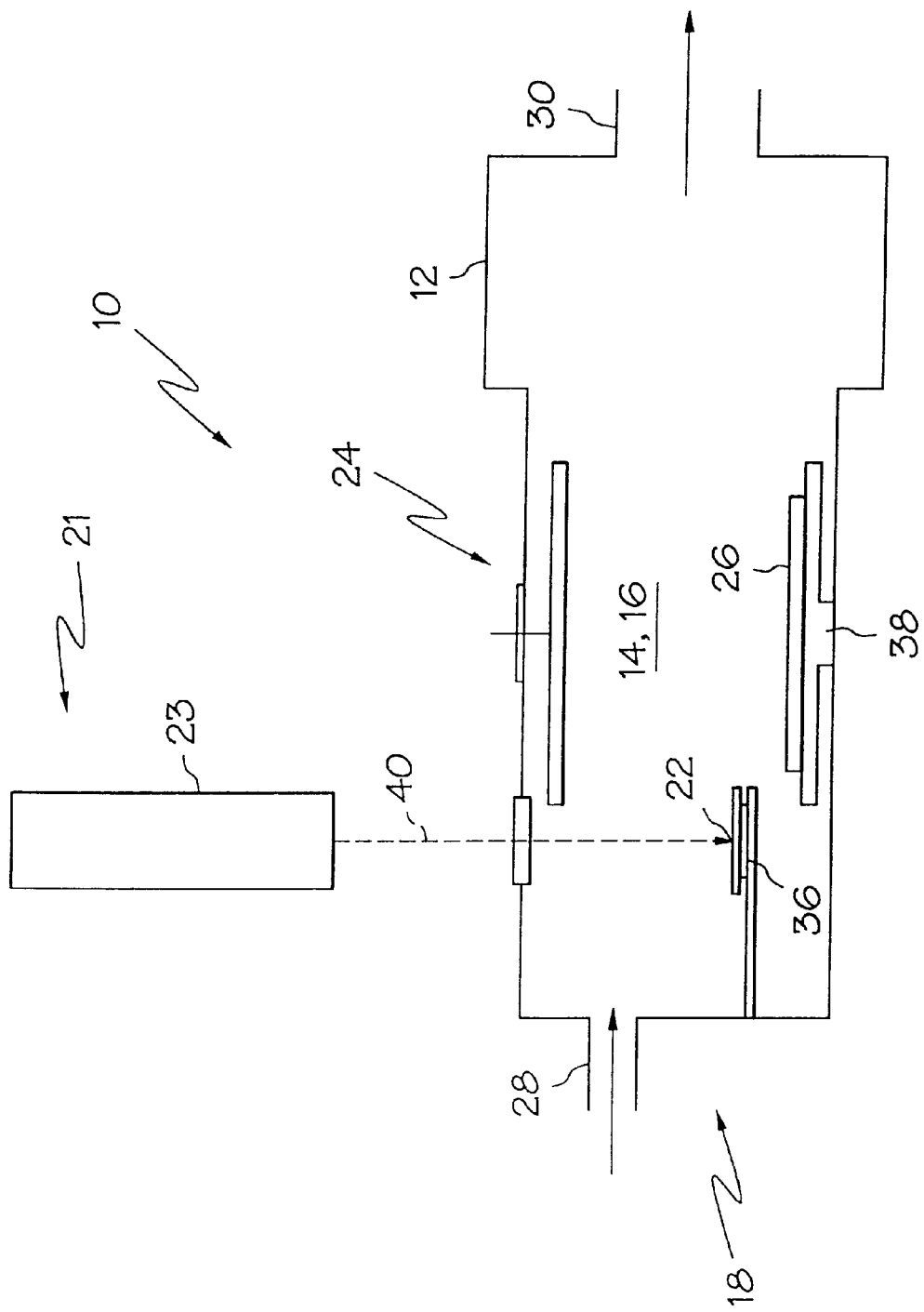
FIG. 2 is a schematic illustration of an alternative chemical vapor deposition apparatus according to the present invention.

The chemical vapor deposition apparatus comprises a chamber 12 defining a precursor desorption region 14 and a precursor deposition region 16. The precursor desorption region 14 and the precursor deposition region 16 may be spaced apart along a precursor flow path extending between a carrier gas inlet 28 and a carrier gas outlet 30, as is illustrated in FIG. 1. Alternatively, the precursor desorption region 14 and the precursor deposition region 16 may be defined, at least in part, in a common area, as is illustrated in FIG. 2. Although a carrier gas flowing from the carrier gas inlet 28 to the carrier gas outlet 30 aids in the transport of desorbed precursor species, it is contemplated by the present invention that the carrier gas is not a necessary component of the present invention.

A target 18 comprising CVD precursor particles 19 and adjacent particles 20 is positioned within the precursor desorption region 14. For the purposes of describing and defining the present invention, it is understood that an adjacent particle 20 is any particle, e.g., an atom, a molecule, an ion, or groups or combinations thereof, which is adjacent to another particle. A CVD precursor particle 19 comprises any particle suited for chemical vapor deposition upon a substrate or wafer.

Figure 3:
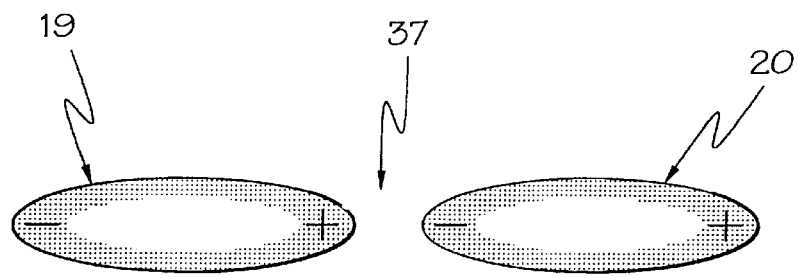
FIGS. 3 and 4 are schematic illustrations of a precursor particle and an adjacent particle according to the present invention.

FIG. 3 illustrates an embodiment of the present invention wherein the precursor particles 19 comprise precursor molecules and the adjacent particles 20 comprise adjacent molecules bonded to the precursor molecules via an intermediate bond 37. For example, the intermediate bond is typically the result of van der Waals forces. The precursor particles 19 and the adjacent particles 20 may comprise a solution, a collection of precursor particles held in a matrix of adjacent particles, a solid, a liquid, or a similar object comprising particles bound via van der Waals forces or other similar intermolecular bonding forces.

The particles 19, 20 may comprise one or more types of molecules having distinct chemical compositions.

Figure 4:
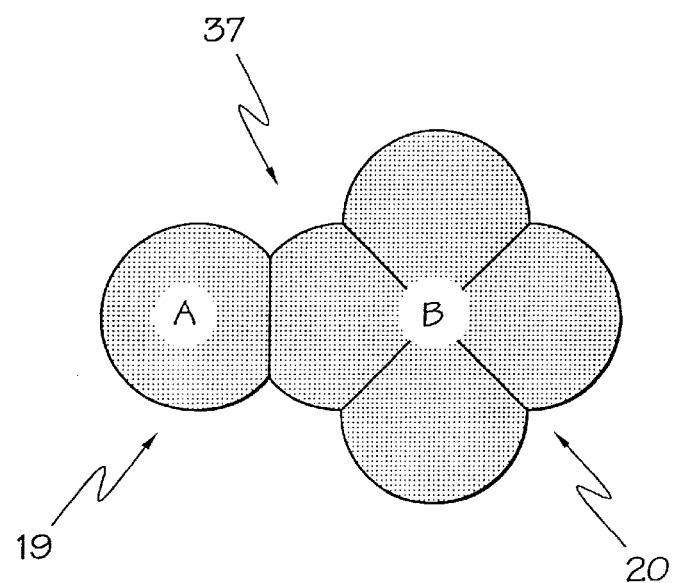

FIG. 4 illustrates an embodiment of the present invention wherein the precursor particles 19 comprise precursor atoms or molecules and the adjacent particles 20 comprise adjacent atoms or molecules chemically bonded to the precursor atoms via an intermediate bond 37. For convenience of illustration, a relatively simple single precursor atom and a relatively simple single adjacent atom are shown in FIG. 4. However, it is contemplated by the present invention that the precursor particle 19 and the adjacent particle 20 may comprise respective pluralities of atoms or ions forming a relatively large complex molecule. For example, the particles 19, 20 may comprise a single type of molecule having a single chemical composition.

Alternatively, the adjacent particle 20 may comprise an organic molecule and the precursor particle 19 may comprise barium bonded to the organic molecule. The following are illustrative examples of precursor particles according to this aspect of the present invention: $Ba(Thd)_2$, $Sr(Thd)_2$, or $TiO(DPM)_2$, where $(Thd)_2$ refers to bis(2,2,6,6-Tetramethyl-3,5-heptanedionate) and $(DPM)_2$ refers to bis (dipivaloymethanate) Further, according to this aspect of the present invention, the target 18 may comprise: a predetermined mixture comprising any combination of $Ba(Thd)_{21}$ $Sr(Thd)_2$, or $TiO(DPM)_2$; any one of $Ba(Thd)_2$, $Sr(Thd)_2$, or $Tio(DPM)_2$ delivered by conventional means; or any one of $Ba(Thd)_2$, $Sr(Thd)_2$, or $TiO(DPM)_2$ delivered in a suitable matrix, e.g., (matrix).

Figure 5:
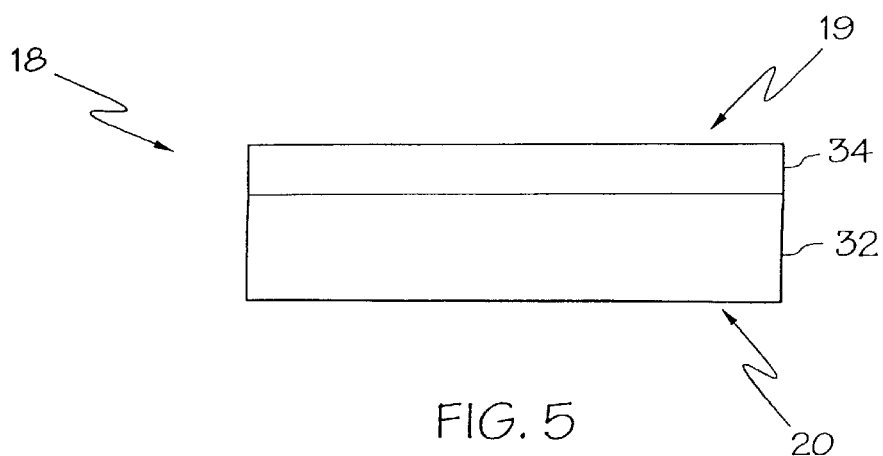
FIG. 5 is a schematic illustration of precursor particles supported by a substrate according to the present invention.

FIG. 5 illustrates an embodiment of the present invention wherein adjacent particles 20 form a target substrate 32. A layer 34 comprising precursor particles 19, and perhaps further adjacent particles 20, is supported by the target substrate 32. The layer 34 may comprise a mobile or stationary solid or liquid supported by the target substrate 32.

Referring again to FIGS. 1 and 2, a desorption heat source 21 is arranged to induce a predetermined temperature increase in a selected target area 22. Specifically, the desorption heat source 21 comprises an appropriately tuned and oriented laser 23, see FIGS. 1 and 2. Alternatively, the heat source 21 may comprise any energy source arranged to introduce the predetermined rate of temperature increase described herein, e.g., MeV energy fission products of californium 252, a beam of primary ions in the KeV energy range, etc.

The predetermined temperature increase is characterized by a predetermined heating rate. The predetermined heating rate is selected such that heat energy causes the desorption of at least one CVD precursor particle 19 intact from the target 18. Specifically, the predetermined temperature increase is characterized by as high a heating rate as possible, e.g., at least about $10^6$ K/sec and preferably at least about $10^9$ K/sec. The precursor particle remains intact, according to one embodiment of the present invention, because a substantial portion of the heat energy is not transferred to the internal modes of the CVD precursor particle due to an effective bottleneck which occurs in the energy flow from the adjacent particles 20 to the internal modes of the precursor. Thus, the intermediate bonds 37 are heated at a higher rate than the internal bonds of the precursor particles 19.

The degree to which the energy flow is blocked is a direct function of the heating rate. For example, conventional heating rates on the order of 10 K/sec will be characterized by insignificant blockage of energy flow, while higher heating rates, e.g., on the order of $10^6$ K/sec, are characterized by significant blockage. It is contemplated by the present invention that preferred or ideal heating rates for intact desorption of CVD precursor particles 19 are determined according to the particular preferences of those practicing the present invention and the specific composition of the CVD precursor particles 19.

Thus, relatively cold precursor particles 19 are desorbed from the target 18 and thermal decomposition and other problems typically associated with thermal desorption of certain precursor materials are avoided. For the purposes of describing and defining the present invention, as will be appreciated by those skilled in the art, the predetermined temperature increase and the heating rate are direct functions of the average kinetic energy of the selected target area 22.

In one embodiment of the present invention, the target 18 comprises CVD precursor particles 19 bonded to adjacent particles via an intermediate bond 37 characterized by a photo-absorption band. As will be appreciated by those skilled in the art, specific photo-absorption bands for a variety of bonds are known and generally available. Precursor particles 19 are desorbed from the target 18 by selecting a predetermined pulsed laser beam wavelength and focusing the pulsed laser beam 40 on the selected target area 22. As noted above, the pulsed laser beam 40 is tuned such that the predetermined wavelength falls within the photo-absorption band of the intermediate bond 37. In this manner, selected portions of a precursor particle 19, e.g. an organic molecule bonded to a metal, may be desorbed from the target 18.

In operation, the target 18 is positioned within the chamber 12. Precursor particles 19 are desorbed from the target 18 to define the precursor desorption region 14 adjacent the target 18 by inducing a predetermined temperature increase in the selected target area 22. As a specific example, precursor particles 19 are desorbed from the target by focusing a pulsed laser beam 40 of a predetermined wavelength on the selected target area 22.

The pulsed laser beam is tuned by adjusting the wavelength, pulse width, pulse frequency, power density, etc., of the laser beam so as to increase the temperature of the selected target area at a heating rate above approximately $10^6$ K/sec and preferably above approximately $10^9$ K/sec. The specific tuned values selected to achieve heating rates according to the present invention are dependent upon the particular target composition and, accordingly, are determined experimentally for specific targets 18. Typical values are likely to include wavelengths ranging from infrared to ultraviolet, pulse widths under 10 ns, pulse frequencies above 500 HZ, and pulse power densities of approximately 1 MW/cm$^2$.

To facilitate uniform desorption, according to one aspect of the present invention, the target 18 and the pulsed laser beam 40 are moved relative to each other. Specifically, the pulsed laser beam 40 may be scanned across the surface of the target 18. Alternatively, the target 18 may be mounted on a movable stage 36 or a liquid precursor solution could be flowed over a fixed substrate.

A carrier gas is introduced into the precursor desorption region 14 via the carrier gas inlet 28 such that precursor particles 19 desorbed in the manner described above are directed into the deposition region 16. Desorbed precursor particles contact or precipitate upon a deposition substrate 26 positioned in particulate communication with the precursor deposition region 16, see FIGS. 1 and 2. The deposition substrate 26 is supported on a rotatable stage 38 which is activated during deposition to ensure uniform deposition. In this manner, the deposition substrate 26 is coated with a layer of material, the specific composition of which is determined according to the composition of the desorbed precursor particles.

According to one aspect of the present invention, the composition of the target 18 is selected such that desorbed precursor particles 19 contact the deposition substrate 26, migrate about the substrate surface, and decompose to form a deposition layer on the deposition substrate 26. This migration and subsequent decomposition yields a uniformly and thoroughly coated substrate 26 because precursor particles are given the opportunity to migrate over portions of the surface of the deposition substrate 26 which, as a result of surface topography and other physical parameters, are less likely to be initially contacted by desorbed precursor particles 19.

To enable the above described migration and subsequent decomposition, the precursor particle 19 preferably comprises an atom or molecule bonded to an organic molecule. The following are illustrative examples of precursor particles according to this aspect of the present invention: Ba(Thd)$_2$, Sr(Thd)$_2$, or TiO(DPM)$_2$, where (Thd)$_2$ refers to bis(2,2,6,6-Tetramethyl-3,5-heptanedionate) and (DPM)$_2$ refers to bis(dipivaloymethanate). Specifically, as is noted above, the target 18 may comprise: a predetermined mixture comprising any combination of Ba(Thd)$_2$, Sr(Thd)$_2$, or TiO(DPM)$_2$; any one of Ba(Thd)$_2$, Sr(Thd)$_2$, or TiO(DPM)$_2$ delivered by conventional means; or any one of Ba(Thd)$_2$, Sr(Thd)$_2$, or TiO(DPM)$_2$ delivered in a suitable matrix.

Heating elements 42 form a deposition region heat source arranged to heat the deposition substrate in the deposition region 16 to facilitate migration and decomposition of the desorbed precursor particles on the surface of the deposition substrate 26. The heating elements are controlled such that the desorbed precursor particles are caused to migrate about the surface prior to decomposition. Specifically, the temperature of the deposition substrate 26 is controlled such that it lies in the vicinity of the characteristic decomposition temperature of the desorbed precursor particles. The precise substrate temperature is to be selected through ordinary experimentation and will vary among specific applications of the present invention, depending upon the particular composition of the precursor particle and the preferred degree of precursor migration. The deposition region heat source may comprise any of a variety of heating arrangements coupled either directly or indirectly to the deposition substrate 26.

A reactive source 24 is included in the event it is necessary or preferable to reduce the desorbed precursor particles in the deposition region. According to one embodiment of the present invention, the reactive source 24 comprises a gas supply 25, e.g., ammonium or hydrogen. According to another embodiment of the present invention, the reactive source 24 comprises an RF electrode 31 operative to induce plasma enhanced CVD, see FIG. 2.

Having described the invention in detail and by reference to preferred embodiments thereof, it will be apparent that modifications and variations are possible without departing from the scope of the invention defined in the appended claims.

What is claimed is:

1. A chemical vapor deposition process comprising the steps of:
   positioning a target within a chamber, said target comprising CVD precursor particles, said CVD precursor particles having a characteristic precursor particle vaporization temperature;
   transferring heat energy to a selected target area of said target to induce a predetermined temperature increase in said selected target area, wherein said predetermined temperature increase is characterized by a predetermined heating rate, and wherein said predetermined heating rate is selected such that said heat energy causes the desorption of at least one CVD precursor particle to define a precursor desorption region and such that a substantial portion of said heat energy is not transferred to the internal energy modes of said CVD precursor particle, whereby said transfer of heat energy to said selected target area induces said predetermined temperature increase in said selected target area without raising the temperature of precursor particles within said selected target area to said characteristic precursor particle vaporization temperature; and
   positioning a deposition substrate in particulate communication with said precursor desorption region.

2. A chemical vapor deposition process comprising the steps of:
   positioning a target within a chamber, said target comprising CVD precursor particles bound to adjacent particles via intermediate bonds, wherein said CVD precursor particles have a characteristic precursor particle vaporization temperature;
   transferring heat energy to a selected target area of said target to induce a predetermined temperature increase in said selected target area, wherein said predetermined temperature increase is characterized by a predetermined heating rate, and wherein said predetermined heating rate is selected such that said intermediate bonds are heated at a higher rate than internal bonds of said precursor particles, whereby said transfer of heat energy to said selected target area induces said predetermined temperature increase in said selected target area without raising the temperature of precursor particles within said selected target area to said characteristic precursor particle vaporization temperature; and positioning a deposition substrate in particulate communication with said selected target area.

3. A chemical vapor deposition process comprising the steps of:

positioning a target within a chamber, said target comprising CVD precursor particles and adjacent particles, wherein said CVD precursor particles have a characteristic precursor particle vaporization temperature;

desorbing said precursor particles from said target to define a precursor desorption region adjacent said target by focusing a pulsed laser beam on said selected target area, wherein said pulsed laser beam is characterized by a pulse width of about 10 ns or less and wherein said pulsed laser beam is operative to increase the temperature of a selected target area of said target at a heating rate of at least about $10^6$ K/sec, whereby said transfer of heat energy to said selected target area induces said predetermined temperature increase in said selected target area without raising the temperature of precursor particles within said selected target area to said characteristic precursor particle vaporization temperature; and positioning a deposition substrate in particulate communication with said precursor desorption region.

4. A chemical vapor deposition process comprising the steps of:

positioning a target within a chamber, said target comprising CVD precursor particles defining characteristic internal energy modes;

transferring heat energy to a selected target area of said target by focusing a pulsed laser beam of a predetermined power, wavelength, and pulse width on a selected target area of said target, wherein said power, wavelength, and pulse width of said pulsed laser beam are selected such that at least one CVD precursor particle is desorbed from said selected target area to define a precursor desorption region and such that a substantial portion of said heat energy is not transferred to said internal energy modes of said CVD precursor particle; and positioning a deposition substrate in particulate communication with said precursor desorption region.

* * * * *

UNITED STATES PATENT AND TRADEMARK OFFICE
CERTIFICATE OF CORRECTION

PATENT NO : 6,187,392 B1
DATED : February 13, 2001
INVENTOR(S) : Eugene P. Marsh It is certified that error appears in the above-identified patent and that said Letters Patent is hereby corrected as shown below:

Column No. 5, line 63, reads as "Ba(Thd)21" should read - - Ba(Thd)2, - - .
Column No. 5, line 65, reads as "Tio(DPM)2" should read - - TiO(DPM)2 - - .
Column No. 6, line 56, reads as "particles via" should read - - particles 20 via - - .
Column No. 7, line 64, reads as "Ba(Thd)21" should read - - Ba(Thd)2, - - .

Signed and Sealed this

Twenty-ninth Day of May, 2001

*Attest:*

NICHOLAS P. GODICI

*Attesting Officer*     *Acting Director of the United States Patent and Trademark Office*